United States Patent
Wang

(10) Patent No.: US 11,335,301 B2
(45) Date of Patent: May 17, 2022

(54) DEVICES AND METHODS FOR DIMMING A DISPLAY SCREEN

(71) Applicant: KUNSHAN GO-VISIONOX OPTO-ELECTRONICS CO., LTD., Kunshan (CN)

(72) Inventor: Yuqing Wang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 17/238,195

(22) Filed: Apr. 22, 2021

(65) Prior Publication Data

US 2021/0241722 A1  Aug. 5, 2021

Related U.S. Application Data

(63) Continuation-in-part of application No. 16/876,125, filed on May 18, 2020, now Pat. No. 11,037,529.
(Continued)

(30) Foreign Application Priority Data

Jun. 30, 2017 (CN) .......................... 201710524423.7

(51) Int. Cl.
G09G 5/10 (2006.01)
G09G 3/20 (2006.01)

(52) U.S. Cl.
CPC .............. G09G 5/10 (2013.01); G09G 3/20 (2013.01); G09G 2320/064 (2013.01); G09G 2320/0646 (2013.01)

(58) Field of Classification Search
CPC ... G09G 3/3233; G09G 3/3258; G09G 3/3208
See application file for complete search history.

(56) References Cited

U.S. PATENT DOCUMENTS

2008/0284693 A1   11/2008  Sarma et al.
2009/0079679 A1*   3/2009  Nam ..................... G09G 3/3233
                                                          345/82
(Continued)

FOREIGN PATENT DOCUMENTS

JP         2008529083 A        7/2008

OTHER PUBLICATIONS

Extended European Search Report dated Nov. 5, 2019 in corresponding EP Application No. 18824995.7.
(Continued)

*Primary Examiner* — Koosha Sharifi-Tafreshi
(74) *Attorney, Agent, or Firm* — Kilpatrick Townsend & Stockton

(57) ABSTRACT

A device for dimming a display screen includes a pixel driving circuit including a first Thin-Film Transistor, a second Thin-Film Transistor, a third Thin-Film Transistor, a capacitor and a pixel. Signals received by a gate of the first Thin-Film Transistor and a first electrode of the first Thin-Film Transistor correspond to a scanning signal Vscan and a data signal Vdata, respectively. Signals received by a gate of the third Thin-Film Transistor and a first electrode of the third Thin-Film Transistor correspond to a Vpwm signal and a transmitted signal transmitted from a second electrode of the second Thin-Film Transistor, respectively. A second electrode of the third Thin-Film Transistor is connected to the pixel. The capacitor is connected between the gate of the second Thin-Film Transistor and a power supply.

13 Claims, 3 Drawing Sheets

Related U.S. Application Data which is a continuation-in-part of application No. 16/328,735, filed as application No. PCT/CN2018/086764 on May 14, 2018, now Pat. No. 10,699,675.

(56) References Cited

U.S. PATENT DOCUMENTS

| | | | |
|---|---|---|---|
| 2009/0278828 A1 | 11/2009 | Fletcher et al. | |
| 2011/0193892 A1* | 8/2011 | Eom | G11C 19/28 |
| | | | 345/690 |
| 2014/0063078 A1* | 3/2014 | Choi | G09G 3/20 |
| | | | 345/690 |
| 2016/0189623 A1* | 6/2016 | Miwa | G09G 3/3258 |
| | | | 345/212 |
| 2016/0232848 A1 | 8/2016 | Meng et al. | |
| 2019/0114964 A1* | 4/2019 | Sung | G09G 3/2022 |

OTHER PUBLICATIONS

Office Action of JP Patent Application No. 2021-053882 dated Jan. 4, 2022.

\* cited by examiner

DEVICES AND METHODS FOR DIMMING A DISPLAY SCREEN

CROSS-REFERENCE TO RELATED APPLICATIONS

This application is a continuation-in-part of U.S. patent application Ser. No. 16/876,125, filed on May 18, 2020, which is a continuation-in-part of U.S. patent application Ser. No. 16/328,735, filed on Feb. 27, 2019, which is a 35 USC § 371 U.S. national stage filing of International Patent Application No. PCT/CN2018/086764 filed on May 14, 2018, and claiming priority under the Paris Convention to Chinese Patent Application No. CN 201710524423.7 filed on Jun. 30, 2017, all of which are incorporated herein by reference for all that they teach and disclose without exclusion of any portion thereof.

TECHNICAL FIELD

The present disclosure relates to the technology field of display.

SUMMARY

In view of above, it is needed to provide devices and methods for dimming a display screen in regard with the problem that how to mitigate impacts on the display quality while dimming.

According to an aspect of the present disclosure, a device for dimming a display screen is provided. The device includes a pixel driving circuit including a first Thin-Film Transistor, a second Thin-Film Transistor, a third Thin-Film Transistor, a capacitor and a pixel. Signals received by a gate of the first Thin-Film Transistor and a first electrode of the first Thin-Film Transistor correspond to a scanning signal Vscan and a data signal Vdata, respectively. Signals received by a gate of the third Thin-Film Transistor and a first electrode of the third Thin-Film Transistor correspond to a Vpwm signal and a transmitted signal transmitted from a second electrode of the second Thin-Film Transistor, respectively. A second electrode of the third Thin-Film Transistor is connected to the pixel. The capacitor is connected between the gate of the second Thin-Film Transistor and a power supply. According to another aspect of the present disclosure, a method for dimming a display screen is provided.

The method includes acquiring, by a device for dimming the display screen, a parameter value of the display screen to be adjusted, the parameter value having a correspondence with a brightness of the display screen; comparing, by the device, the parameter value with a set threshold to obtain a comparison result; determining, by the device, a corresponding dimming mode according to the comparison result; and performing; by the device, dimming on the display screen in the corresponding dimming mode. The device includes a pixel driving circuit including a first Thin-Film Transistor, a second Thin-Film Transistor, a third Thin-Film Transistor, a capacitor and a pixel. Signals received by a gate of the first Thin-Film Transistor and a first electrode of the first Thin-Film Transistor correspond to a scanning signal Vscan and a data signal Vdata, respectively. Signals received by a gate of the third Thin-Film Transistor and a first electrode of the third Thin-Film Transistor correspond to a Vpwm signal and a transmitted signal transmitted from a second electrode of the second Thin-Film Transistor, respectively. A second electrode of the third Thin-Film Transistor is connected to the pixel. The capacitor is connected between the gate of the second Thin-Film Transistor and a power supply.

After acquiring a parameter value of the display screen to be adjusted, the parameter value will be compared with a set threshold to obtain a comparison result, and a corresponding dimming mode will be determined according to the comparison result to perform dimming on the display screen according to the method, apparatus, storage medium and electronic device for dimming a display screen as described above. Since various dimming modes have different performances with different brightnesses, if only one dimming mode is determined for dimming, the display quality may be reduced with the brightness with which the one dimming mode does not perform good. Therefore, the above device and method for dimming a display screen that determines a dimming mode according to a comparison result may overcome the deficiency caused by determining only one dimming mode, and may further mitigate impacts on the display quality while dimming.

BRIEF DESCRIPTION OF THE DRAWINGS

For the purpose of illustrating the technical solutions of the embodiments of the present disclosure or of the prior art more explicitly, the accompanying drawings to be used necessarily for the description of the embodiments or the prior art will be briefly described below. Apparently, the accompanying drawings described below are part of the embodiments of the disclosure only, and accompanying drawings of the other embodiments may further be acquired based on these accompanying drawings herein without creative efforts to those of ordinary skill in the art.

DETAILED DESCRIPTION OF THE EMBODIMENTS

In some specific application fields (e.g., display screens for cockpits, aeronautical equipment, handheld devices and the like), display screens are desired to have a good dimming performance, so as to be able to be watched comfortably either in daytime or at night. However, since the traditional dimming technologies may reduce the display quality during the process of dimming, the problem that how to mitigate impacts on the display quality while dimming is very desired to be solved.

To facilitate understanding the present disclosure, it will be described hereinafter more thoroughly in reference with the relative accompanying drawings. The preferred embodiments of the present disclosure are provided in the accompanying drawings. However, the present disclosure may be implemented in various forms, and not limited in the embodiments described herein. In contrast, the objective of providing these embodiments is to understand the disclosed description of the present disclosure more thoroughly.

All technical and scientific terms as used herein have the same meaning as commonly understood by those skilled in the art, unless those defined otherwise in context. The terms as used herein in the description of the present disclosure are for the purpose of describing particular embodiments only, and are not intended to be limiting of the present disclosure. The term "and/or" as used herein includes arbitrary and all combinations of one or more of the associated listed items.

One implementation provides a method for dimming a display screen, which may be performed by a peripheral drive chip for controlling the display screen. Specifically, the display screen may drive a pixel by a thin-film transistor. Specifically, the display screen, for example, includes a pixel matrix, a row driving circuit and a column driving circuit. The pixel matrix includes a plurality of pixel driving circuits and a plurality of pixels, each of which is controlled by one of the pixel driving circuits. The row driving circuit sends a scanning signal to each of the pixel driving circuits via a row (scanning) address bus. The column driving circuit sends a data signal to each of the pixel driving circuits via a column (data) address bus. The peripheral drive chip, which is responsible for processing and transmitting data, sending control signals and the like functions of the whole display screen, is electrically connected to the row driving circuit and the column driving circuit respectively. The peripheral drive chip is consisted of, e.g., a single-chip microcomputer (or FPGA) and a peripheral module.

Figure 1:
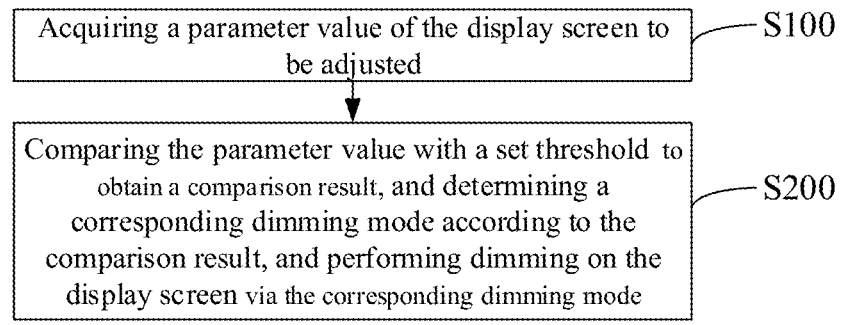
FIG. 1 is a flow diagram of the method for dimming a display screen provided by an implementation.

In reference with FIG. 1, the method for dimming a display screen provided in the present implementation includes the following steps.

At step S100, a parameter value of the display screen to be adjusted is acquired. In such a context, the parameter value has a correspondence with a brightness of the display screen.

In such a context, the parameter value of the display screen to be adjusted implies that it is expected to adjust the parameter of the display screen to the parameter value. The fact that the parameter value has a correspondence with a brightness of the display screen implies that the parameter value will change in turn if the brightness is changing. The parameter value is for example a brightness value, a voltage value, a current value, or a gray scale. The parameter value may be set by a user via an interactive interface of the device provided with the display screen, and the parameter value set by the user is sent to the peripheral drive chip by the CPU of the device after the user setting is accomplished. Alternatively, the parameter value to be adjusted may also be generated automatically by the CPU or the peripheral drive chip (i.e., having an automatic dimming functionality). For example, it is assumed that the parameter value is a brightness value, it is possible then to provide a light sensor configured to detect an external light intensity. The CPU or the peripheral drive chip generates a brightness value suitable for the user to watch according to the light intensity value detected by the light sensor, and this brightness value serves as the brightness value to be adjusted.

At step S200, the parameter value is compared with a set threshold to obtain a comparison result, and a corresponding dimming mode is determined according to the comparison result to perform dimming on the display screen.

At this step, a different dimming mode may be determined when the comparison result is different. For example, when the parameter values falls within different ranges, a dimming mode having a better dimming performance than that within the other ranges is determined to perform the dimming By way of example, it is assumed that the impact of the first dimming mode on the display quality with a parameter value within a first range is less than the impact of the first dimming mode on the display quality with a parameter value within a second range, while the impact of the second dimming mode on the display quality with the parameter value within the second range described above is less than the impact of the second dimming mode on the display quality with the parameter value within the first range described above. Thereby, if it is determined that a parameter value falls in the first range, the first dimming mode described above is then used to perform dimming, while if it is determined that the parameter value falls in the second range, the second dimming mode is then used to perform dimming, so that the display quality can be improved while dimming.

Since various dimming modes have different performances with different brightnesses, if only one dimming mode is determined for dimming, the display quality may be reduced with the brightness with which the one dimming mode does not perform good. Therefore, the above method for dimming a display screen that determines a dimming mode according to a comparison result may overcome the deficiency caused by determining only one dimming mode, and may further mitigate impacts on the display quality while dimming.

In one of the embodiments, the display screen described above drives a pixel by a thin-film transistor (TFT). Furthermore, the step S200 as described above includes the following steps in reference with FIG. 2.

At step S210, a first dimming mode is adopted to perform the dimming on the display screen when it is determined that the brightness corresponding to the parameter value is less than the set threshold. A voltage of a data signal received by a pixel driving circuit in the display screen is not changed during a process of the dimming in the first dimming mode.

In such a context, the set threshold is for example between 70 nits and 90 nits. Optionally, the set threshold is 80 nits. One of the pixel driving circuits is shown as in FIG. 3. In this pixel driving circuit, a first TFT T1, a second TFT T2, a third TFT T3, a capacitor C1 and a pixel D1 are included. In such a context, a gate and a drain of the TFT T1 are connected respectively to the row address bus and the column address bus. Furthermore, the signals received by the gate and the drain of the first TFT T1 correspond to the scanning signal (Vscan) and the data signal (Vdata). In the embodiment shown in FIG. 3, thus the voltage of the data signal received by the drain of the first TFT T1 is not changed during the process of the dimming, but the dimming is performed by changing input signals from other devices in the pixel driving circuit in the first dimming mode.

If the dimming is performed by changing the voltage of the data signal during the process of the dimming, the lower the brightness value to be adjusted is, the higher the voltage of the data signal is required to be. In such a context, it will increase the difference in characteristics of the TFTs, resulting in occurring the phenomenon of uneven brightness in the row direction of the screen. In this embodiment, thus when the brightness corresponding to the parameter value to be adjusted is less than the set threshold, the adopted first dimming mode then performs the dimming not by changing the voltage of the data signal, but in other manners, so as to avoid occurring the phenomenon of uneven brightness in the row direction of the screen resulted from the increase of the difference in characteristics of the TFTs.

In one of the embodiments, the step S200 further includes adopting the second dimming mode, when it is determined that the parameter value is not less than the set threshold. In such a context, the step S200 described above specifically includes the following steps in combination with the step S210 of the embodiment in reference with FIG. 4 as described above.

At step S211, it is determined whether the brightness corresponding to the parameter value is less than the set threshold. If it is positive, the step S212 is performed. If it is negative, the step S213 is performed.

At step S212, the first dimming mode is adopted.

At step S213, the second dimming mode is adopted. In such a context, the dimming is performed by adjusting the voltage of the data signal in the second dimming mode.

In this embodiment, thus when it is desired to be adjusted to a high brightness or a low brightness, different dimming modes are adopted respectively, i.e., the second dimming mode is adopted when it is desired to be adjusted to the high brightness, and the first dimming mode is adopted when it is desired to be adjusted to the low brightness.

Figure 3:
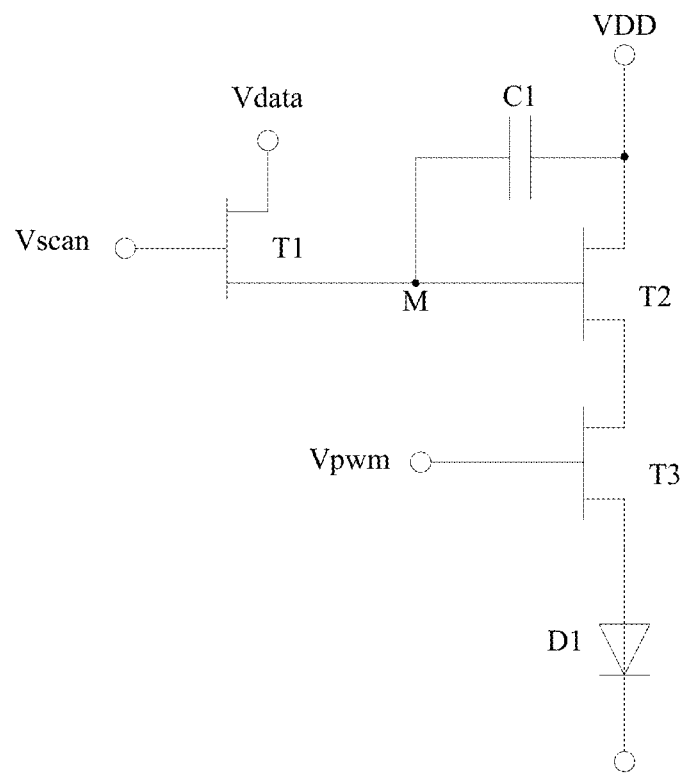
FIG. 3 is a circuit diagram of one of the embodiments of the pixel driving circuit involved in the implementation shown in FIG. 1.

In such a context, the second dimming mode is for example a source dimming mode. As shown in FIG. 3, the expression of current of the pixel D1 is $$I_{oled} = k(VDD - Vdata)^2 \quad (1),$$

wherein $I_{oled}$ is the current of the pixel D1, and k is a coefficient. As known from the formula (1), since the voltage between the power supply VDD and the data signal (Vdata) plays a decisive role to the current of the pixel D1, adjusting the data signal (Vdata) means adjusting the current of the pixel D1 while on the premise that the power supply VDD is unchanged, so as to achieve brightness adjustment. If it is desired to adjust the brightness to be higher, it is required then to reduce the voltage of the data signal (Vdata) If it is desired to adjust the brightness to be lower, it is required then to increase the voltage of the data signal (Vdata).

In view of this, it is required to reduce the voltage of the data signal (Vdata) when it is desired to adjust the brightness to be higher in respect with the second dimming mode. When the voltage of the data signal (Vdata) is sufficiently low, the difference in characteristics of the TFTs is small enough to be ignored. It is required to increase the voltage of the data signal (Vdata) when it is desired to adjust the brightness to be lower, and the lower the brightness value to be adjusted, the higher the voltage of the data signal (Vdata) is required. When the data signal (Vdata) is sufficiently high, the difference in characteristics of the TFTs is so large that the phenomenon of uneven brightness in the row direction of the screen and color spots may occur. Therefore, if continuing to adopt the second dimming mode when it is desired to adjust the brightness lower, the display quality will be affected. In view of the situations described above, if it is desired to adjust the brightness corresponding to the parameter value to be lower than the set threshold in this embodiment, the second dimming mode is switched to the first dimming mode, so as to avoid the phenomenon of uneven brightness in the row direction.

Specifically, the dimming is performed by adjusting the illumination period of the pixel in each frame in the first dimming mode. Optionally, the first dimming mode is an EM (Emission) dimming mode. In such a context, the brightness of the pixel may be reduced by reducing the illumination period of each frame. For example, if the PWM (Pulse Width Modulation) signal is used to control the illumination period of the pixel, the illumination period of each frame may be then reduced by reducing the duty ratio of an active level (e.g., a low level) in the PWM signal, so as to reduce the brightness of the pixel. In such a context, the pixel illuminates only with the active level.

The working principle of the first dimming mode described above will be then illustrated in reference with FIG. 3 as an example. If the first dimming mode is adopted, it is only required to adjust the duty ratio of the Vpwm signal applied to the gate of the third TFT T3, but without changing the data signal (Vdata), to change the illumination period of the pixel D1 in each frame, such that the brightness of the pixel D1 may be adjusted.

Furthermore, if the dimming is performed by adjusting the duty ratio of the PWM in the first dimming mode, the dimming frequency is then fixed, where the phenomenon of photo screen rolling may occur under high brightness conditions. In this embodiment, thus if the parameter value to be adjusted is higher than the set threshold, the second dimming mode is adopted so as to avoid occurring the deficiency of the photo screen rolling described above, which further improves the display quality.

In a specific embodiment, the dimming process includes following phases.

A parameter value of the display screen to be adjusted is acquired, the parameter value corresponding to a brightness of the display screen.

The parameter value is compared to a first set threshold and a second set threshold respectively.

When the parameter value is equal to or greater than the first set threshold, it is in a first phase. In the first phase, the dimming process includes performing dimming on the display screen, via both emission dimming mode and source dimming mode, or the source dimming mode, under a one-pulse condition, to adjust duty ratio of PWM (Pulse Width Modulation) to a first duty ratio.

When the parameter value is less than the first set threshold, and is equal to or greater than the second set threshold, it is in a second phase. In the second phase, the dimming process includes performing dimming on the display screen, via both emission dimming mode and source dimming mode, or the source dimming mode, under a multi-pulse condition, to adjust the duty ratio of PWM to a second duty ratio.

Figure 6:
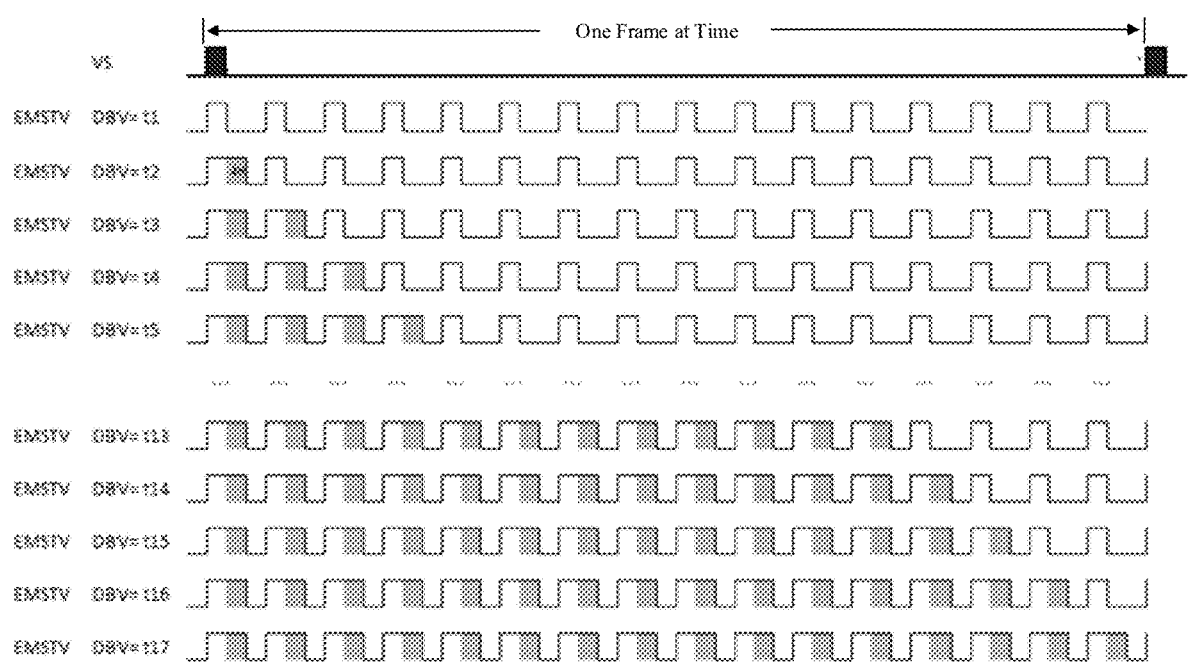
FIG. 6 shows a duty ratio of PWM changes along with sequentially happenings of pulses in the multi-pulse condition.

The second set threshold is less than the first set threshold, and the second duty ratio is less than the first duty ratio. In the second phase, as shown in FIG. 6, the duty ratio of PWM under the multi-pulse condition is changed one by one in sequence, along with sequentially happenings of pulses in the multi-pulse condition.

When the parameter value is less than the second set threshold, it is in a third phase. In the third phase, the dimming process includes performing dimming on the display screen via the emission dimming mode, under another multi-pulse condition, to adjust the duty ratio of PWM to a third duty ratio less than the second duty ratio. In the third phase, as shown in FIG. 6, the duty ratio of PWM under the another multi-pulse condition is changed one by one in sequence, along with sequentially happenings of pulses in the another multi-pulse condition.

Under the multi-pulse condition, the duty ratio of PWM is changed one by one in sequence, along with sequentially happenings of pulses in the multi-pulse condition. By such dimming process, the brightness can be adjusted into more accurate volume. It would be more stable to emit light.

Optionally, the first set threshold ranges between 350 nits and 380 nits, and the second set threshold ranges between 200 nits and 240 nits.

Optionally, the first duty ratio is greater than 90%, and the second duty ratio is greater than 80%.

Optionally, the third duty ratio ranges between substantially 1% and substantially 88%.

Under the above volume condition, display uniformity can be improved, and brightness can be adjusted to a suitable state. The quality of displaying can be improved.

The duty ratio of PWM refers to a ratio of efficiency level in a frame to be displayed by the display screen. The display screen emits under the efficiency level. The efficiency level can be low level, or high level.

In the emission dimming mode, brightness is adjusted by adjusting the duty ratio of PWM.

In the source dimming mode, brightness is adjusted by adjusting data voltage.

Multi-pulse in the above multi-pulse condition refers to four pulses, eight pulses, sixteen pulses, or other integral multiples of four pulses happened in a frame.

Figure 2:
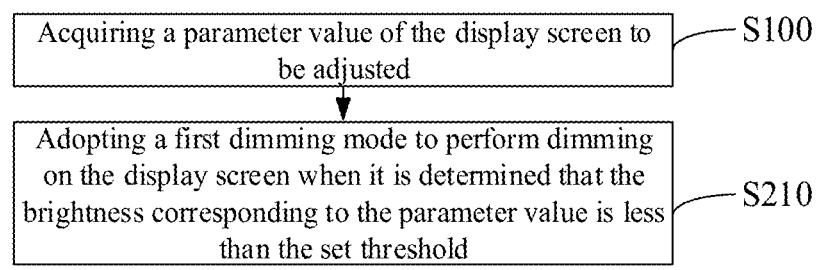
FIG. 2 is a specific flow diagram of one of the embodiments of the method for dimming a display screen of the implementation shown in FIG. 1.
Figure 4:
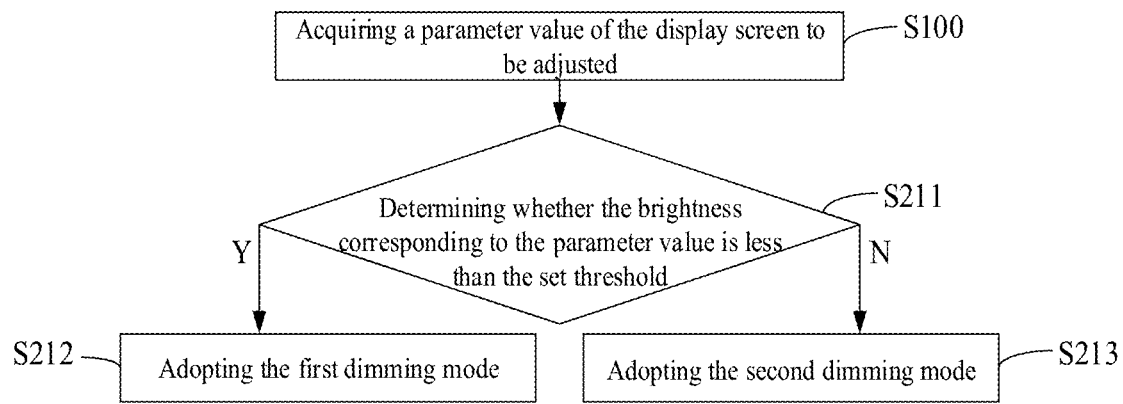
FIG. 4 is a flow diagram of another embodiment of the method for dimming a display screen of the implementation shown in FIG. 1.
Figure 5:
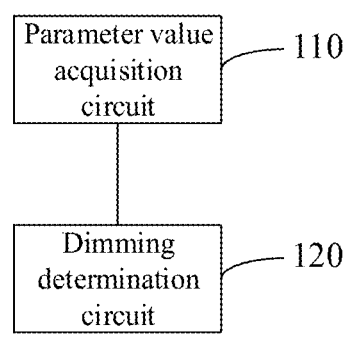
FIG. 5 is a block diagram of the apparatus for dimming a display screen provided in another implementation.

It is to be illustrated that FIG. 1, FIG. 2 and FIG. 4 are the flow schematic diagrams of the method of the embodiments of the present disclosure. It should be understood that although all of the steps in the flow diagrams of FIG. 1, FIG. 2 and FIG. 4 are shown sequentially as the indication of the arrows, these steps do not have to be performed in such sequence as indicated by the arrows. Performing these steps does not have any sequential limitation such that these steps may be performed in another sequence, unless it is illustrated explicitly in the context. Further, at least a part of steps of FIG. 1, FIG. 2 and FIG. 4 may include multiple sub-steps or stages which may be performed at different times rather have to be accomplished at the same time, which may be performed in turn or alternately with the other steps or at least a part of the sub-steps or stages of the other steps, rather have to be performed sequentially.

In detail, signals received by a gate of the first TFT T1 and a first electrode (e.g., drain) of the first TFT T1, correspond to the scanning signal (Vscan) and the data signal (Vdata), respectively. Signals received by a gate of the third TFT T3 and a first electrode (e.g., drain) of the third TFT T3 correspond to a Vpwm signal and a transmitted signal transmitted from a second electrode (e.g., source) of the second TFT T2, respectively. A second electrode (e.g., source) of the third TFT is connected to the pixel, i.e., OLED (Organic Light Emitting Diode). The capacitor C1 is parallel connected between the gate of the second TFT T2 and the power supply VDD. A first electrode (e.g., drain) of the second TFT T2 is connected to the power supply VDD. Signals received by the gate of the second TFT T2 correspond to signals transmitted from the second electrode (e.g., source) of the first TFT T1. Signals received by the gate of the second TFT T2 correspond to a voltage of the data signal (Vdata).

Via the pixel driving circuits, the second TFT T2 and the third TFT T3 can be respectively controlled by the data signal Vdata and the Vpwm signal, respectively. It not only enables the source dimming mode and the EM dimming mode to be changed freely, according to different comparing result, but is also able to make a mix use of both of the two dimming modes. At the same time, it can avoid the signal cross between the signal Vpwm and Vdata, through a quite simple circuit connection.

In another implementation, provided is an apparatus for dimming a display screen in reference with FIG. 4, which includes the below components.

A parameter value acquisition module 110, or can be called into parameter value acquisition module, is configured to acquire a parameter value of the display screen to be adjusted. In such a context, the parameter value has a correspondence with a brightness of the display screen.

A dimming determination module 120, or can be called into dimming selection module 120, is configured to compare the parameter value with a set threshold to obtain a comparison result, and to determine a corresponding dimming mode according to the comparison result to perform dimming on the display screen.

In one of the embodiments, the display screen drives a pixel by a thin-film transistor.

Furthermore, the dimming determination module 120 includes the following elements.

A first dimming determination module, configured to adopt a first dimming mode to perform the dimming on the display screen when it is determined that the brightness corresponding to the parameter value is less than the set threshold. A voltage of a data signal received by a pixel driving module in the display screen is not changed during a process of the dimming in the first dimming mode.

In one of the embodiments, the dimming determination module 120 further includes: a second dimming determination module, configured to adopt the second dimming mode when it is determined that the parameter value is not less than the set threshold. The dimming is performed by adjusting the voltage of the data signal in the second dimming mode.

In one of the embodiments, the dimming is performed by adjusting an illumination period of a pixel of the display screen in each frame in the first dimming mode.

In one of the embodiments, the parameter value is a brightness value.

In one of the embodiments, the set threshold is between 1 nit and 500 nits.

It should be illustrated that the apparatus for dimming a display screen provided in this implementation corresponds to the method for dimming a display screen of the implementation described above, thus it will not be described repeatedly here.

In a further implementation, provided is a storage medium. The storage medium may be a magnetic disk, an optical disk, a Read-Only Memory (ROM), or the like. The storage medium stores a program operable to be executed by a processor to perform the following steps of:

Acquiring a parameter value of the display screen to be adjusted, wherein the parameter value has a correspondence with a brightness of the display screen; and Comparing the parameter value with a set threshold to obtain a comparison result, and determining a corresponding dimming mode according to the comparison result, and performing dimming on the display screen.

It is to be illustrated that the steps performed by the processor in this implementation correspond to the method for dimming a display screen of the implementation described above, thus they will not be described here repeatedly.

In a still further implementation, provided is an electronic device, such as a mobile phone, computer or the like. The electronic device includes a peripheral drive chip and a display screen. The peripheral drive chip includes a processor and a memory storing a program operable to be executed by a processor to cause the processor to perform the following steps of:

Acquiring a parameter value of the display screen to be adjusted, wherein the parameter value has a correspondence with a brightness of the display screen; and Comparing the parameter value with a set threshold to obtain a comparison result, and determining a corresponding dimming mode according to the comparison result, and performing dimming on the display screen.

It is to be illustrated that the steps performed by the processor in this implementation correspond to the method for dimming a display screen of the implementation described above, thus they will not be described here repeatedly.

All of the technical features in the embodiments described above can be employed in arbitrary combinations. For purpose of simplifying the description, not all arbitrary combinations of the technical features in the embodiments described above are described. However, as long as such combinations of the technical features are not contradictory, they should be considered as within the scope of the disclosure in the specification.

The above embodiments are merely illustrative of several implementations of the disclosure, and the description thereof is more specific and detailed, but should not be deemed as limitations to the scope of the present disclosure. It should be noted that variations and improvements will become apparent to those skilled in the art to which the present disclosure pertains without departing from its scope. Therefore, the scope of the present disclosure is defined by the appended claims

What is claimed is:

1. A device for dimming a display screen, comprising:
a pixel driving circuit comprising a first Thin-Film Transistor, a second Thin-Film Transistor, a third Thin-Film Transistor, a capacitor and a pixel;
wherein signals received by a gate of the first Thin-Film Transistor and a first electrode of the first Thin-Film Transistor correspond to a scanning signal Vscan and a data signal Vdata, respectively;
wherein signals received by a gate of the third Thin-Film Transistor and a first electrode of the third Thin-Film Transistor correspond to a Vpwm signal and a transmitted signal transmitted from a second electrode of the second Thin-Film Transistor, respectively;
wherein a second electrode of the third Thin-Film Transistor is connected to the pixel; and
wherein the capacitor is connected between the gate of the second Thin-Film Transistor and a power supply;
wherein the device for dimming the display screen is characterized by a first dimming mode and a second dimming mode, the first dimming mode is activated to perform a first dimming operation on the display screen by adjusting a duty ratio of the Vpwm signal when a parameter value corresponding to a brightness of the display screen is less than a set threshold, the second dimming mode is activated to perform a second dimming operation on the display screen by adjusting a voltage of the data signal Vdata when the parameter value corresponding to the brightness of the display screen is not less than the set threshold.

2. The device of claim 1, wherein the data signal Vdata received by the first electrode of the first Thin-Film Transistor has a constant voltage during a process of the dimming in the first dimming mode.

3. The device of claim 1, wherein the capacitor is parallel connected between the gate of the second Thin-Film Transistor and the power supply.

4. The device of claim 1, wherein a first electrode of the second Thin-Film Transistor is connected to the power supply.

5. The device of claim 1, wherein a signal received by the gate of the second Thin-Film Transistor corresponds to a signal transmitted from the second electrode of the first Thin-Film Transistor.

6. The device of claim 1, wherein a signal received by the gate of the second Thin-Film Transistor corresponds to a voltage of the data signal Vdata.

7. A method for dimming a display screen, comprising:
acquiring, by a device for dimming the display screen, a parameter value of the display screen to be adjusted, the parameter value having a correspondence with a brightness of the display screen;
comparing, by the device, the parameter value with a set threshold to obtain a comparison result;
determining, by the device, whether to perform a first dimming mode or a second dimming mode according to the comparison result; and
performing by the device, dimming on the display screen in the corresponding dimming mode;
wherein the device comprises a pixel driving circuit comprising a first Thin-Film Transistor, a second Thin-Film Transistor, a third Thin-Film Transistor, a capacitor and a pixel;
wherein signals received by a gate of the first Thin-Film Transistor and a first electrode of the first Thin-Film Transistor correspond to a scanning signal Vscan and a data signal Vdata, respectively;
wherein signals received by a gate of the third Thin-Film Transistor and a first electrode of the third Thin-Film Transistor correspond to a Vpwm signal and a transmitted signal transmitted from a second electrode of the second Thin-Film Transistor, respectively;
wherein a second electrode of the third Thin-Film Transistor is connected to the pixel; and
wherein the capacitor is connected between the gate of the second Thin-Film Transistor and a power supply;
wherein the first dimming mode is activated to perform a first dimming operation on the display screen by adjusting a duty ratio of the Vpwm signal when the parameter value corresponding to the brightness of the display screen is less than the set threshold, the second dimming mode is activated to perform a second dimming operation on the display screen by adjusting a voltage of the data signal Vdata when the parameter value corresponding to the brightness of the display screen is not less than the set threshold.

8. The method of claim 7, wherein the capacitor is parallel connected between the gate of the second Thin-Film Transistor and the power supply.

9. The method of claim 7, wherein a first electrode of the second Thin-Film Transistor is connected to the power supply.

10. The method of claim 7, wherein a signal received by the gate of the second Thin-Film Transistor corresponds to a signal transmitted from the second electrode of the first Thin-Film Transistor.

11. The method of claim 7, wherein a signal received by the gate of the second Thin-Film Transistor corresponds to a voltage of the data signal Vdata.

12. The device of claim 1, wherein
the first dimming mode is activated when the display screen is desired to be adjusted to a low brightness, the second dimming mode is activated when the display screen is desired to be adjusted to a high brightness.

13. The method of claim 7, wherein
the first dimming mode is activated when the display screen is desired to be adjusted to a low brightness, the second dimming mode is activated when the display screen is desired to be adjusted to a high brightness.

* * * * *